_United States Patent_ [19]

Shima et al.

[11] Patent Number: 4,532,631
[45] Date of Patent: Jul. 30, 1985

[54] SEMICONDUCTOR LASERS AND METHOD FOR PRODUCING THE SAME

[75] Inventors: Katsuhito Shima, Yokohama; Kiyoshi Hanamitsu, Sagamihara, both of Japan

[73] Assignee: Fujitsu Limited, Kawasaki, Japan

[21] Appl. No.: 432,806

[22] Filed: Oct. 5, 1982

[30] Foreign Application Priority Data

Oct. 5, 1981 [JP] Japan .............................. 56-158447

[51] Int. Cl.$^3$ .............................................. H01S 3/19
[52] U.S. Cl. ....................................... 372/48; 357/17; 372/46
[58] Field of Search ...................... 372/44, 45, 46, 48; 357/17

[56] References Cited

U.S. PATENT DOCUMENTS 4,190,813  2/1980  Logan et al. ........................... 372/48
4,366,569  12/1982  Mirao et al. ........................... 372/46

OTHER PUBLICATIONS

European Patent Application No. 0 044 571, Hitachi, filed Jul. 23, 1981, p. 5, claim 1, FIG. 1.
IEEE Journal of Quantum Electronics, vol. QE-16, No. 2, Feb. 1980, pp. 160-164, New York, Kishino et al., "Fabrication and Leasing Properties of Mesa Substrate Buried Heterostructure GaInAsP/InP Lasers at 1.3 m Wavelength", paragraph II.

Primary Examiner—James W. Davie
Attorney, Agent, or Firm—Staas & Halsey

[57] ABSTRACT

A double heterojunction semiconductor laser having a high output power beam of the fundamental transverse mode, which includes a stripe active layer surrounded with clad layers and which has an upper plane and a lower plane, parallel to the upper plane, and sides inclined toward the upper and lower plane, the sides being uneven in a longitudinal direction.

4 Claims, 9 Drawing Figures

SEMICONDUCTOR LASERS AND METHOD FOR PRODUCING THE SAME

BACKGROUND OF THE INVENTION

1. Field of the Invention

The present invention relates to semiconductor lasers. More particularly, it relates to buried active-layer-type double-heterojunction semiconductor lasers and to a method for producing them.

2. Description of the Prior Art

Semiconductor lasers having various structures have been, heretofore, proposed. For the purpose of decreasing the threshold current of a semiconductor laser and stabilizing the transverse mode of the laser beam, for example, a so-called buried heterostructure laser and a so-called channeled substrate buried heterostructure laser have been proposed.

In the case of the above-mentioned conventional lasers, it is preferable to make a width of a stripe active layer approximately one micrometer to stabilize the transverse mode. In order to increase the available output power of a laser, it is necessary to enlarge an emitting area (i.e., the sectional area) of the active layer. However, when the emitting area is enlarged by increasing the width of the stripe active layer, the transverse mode becomes unstable. Furthermore, since it is difficult to mass produce a conventional laser having a stripe active layer width of 1 μm, a conventional laser having a stripe active layer width of 2 to 3 μm is produced. In this case, when the laser output power becomes 2–3 mW, the laser oscillates a higher order modes.

SUMMARY OF THE INVENTION

An object of the present invention is to provide a semiconductor laser which has a buried stripe active layer and a laser beam having a fundamental transverse mode and a larger output power as compared with the above-mentioned conventional laser.

Another object of the present invention is to provide a semiconductor laser having a smaller threshold current and a smaller beam divergence than those of conventional lasers.

Still another object of the present invention is to provide a method for producing the semiconductor laser.

According to the present invention, a semiconductor laser is comprising a stripe active layer surrounded with clad layers and the stripe active layer has an upper plane and a lower plane, the two planes being parallel to each other, and sides inclined toward the planes. It is preferable that the sides of the stripe active layer be uneven in a longitudinal direction.

According to the present invention, a method for producing the semiconductor laser comprises the steps of forming a current-blocking multilayer comprising a lower layer and an upper layer which form a reverse biased PN junction on a compound semiconductor substrate, forming a groove reaching into the substrate, selectively etching the lower layer to form a recess in the sides of the groove, growing a lower clad layer from the bottom of the groove to the lower edge of the recess, growing a stripe active layer on the lower clad layer, and growing an upper clad layer on the stripe active layer.

DESCRIPTION OF THE PREFERRED EMBODIMENTS

Figure 1:
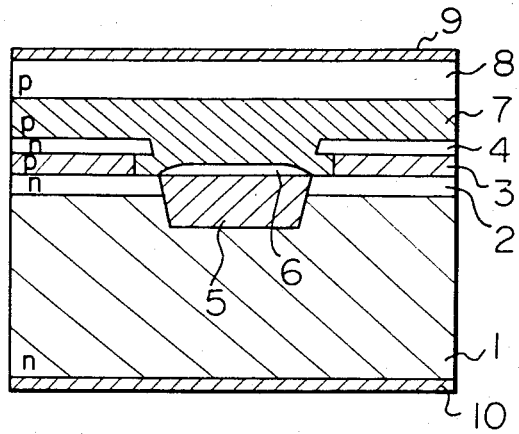
FIG. 1 is a schematic sectional view of a semiconductor laser according to the present invention.

Referring to FIG. 1, a semiconductor laser according to the present invention comprising an N-type compound semiconductor single crystalline substrate 1 of, e.g., GaAs, an N-type layer 2 of, e.g., $Ga_{1y}Al_yAs$ ($Y<0.5$), a P-type layer 3 of, e.g., $Ga_{1x}Al_xAs$ ($x \geq 0.5$), an N-type layer 4 of e.g., GaAs, an N-type clad layer 5 of, e.g., $Ga_{1z}Al_zAs$, a P-type or N-type stripe active layer 6 of, e.g., $Ga_{1-k}Al_kAs$ ($k \approx 0$–$0.1$), a P-type clad lever 7 of, e.g., $Ga_{1-z}Al_zAs$ ($z \approx 0.35$), a P-type cap layer 8 of, e.g., GaAs, and electrode layers 9 and 10. The P-type layer 3 and the N-type layer 4 form a current-blocking multilayer having a reverse-biased PN junction plane. The N-type layer 2 is formed for keeping a distance between the active region and the substrate 1.

Figure 2:
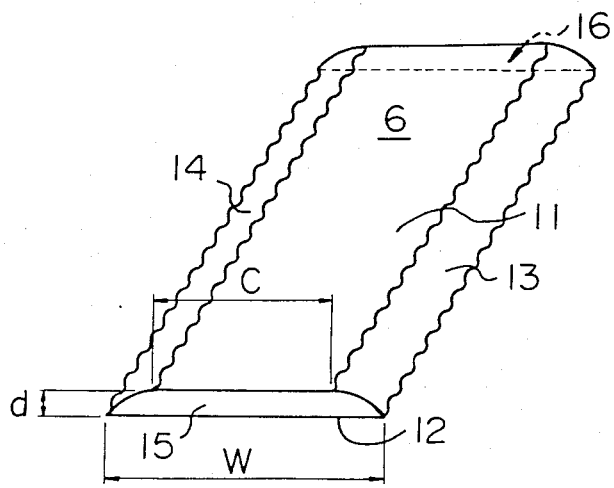
FIG. 2 is a schematic perspective view of a stripe active layer of the semiconductor laser of FIG. 1.

The stripe active layer 6 has an upper plane 11, a lower plane 12, sides 13 and 14, and cleavage planes (reflective mirrors) 15 and 16, as illustrated in FIG. 2. The upper plane 11 has a width C of up to 3.3 μm, and the lower plane 12 has a width W up to 5 μm, these planes being parallel to each other. If the width W of the stripe is above 5 μm, the fundamental transverse mode of a laser beam is changed to a higher order mode. The stripe active layer 6 has a thickness d up to 0.15 μm. The sides 13 and 14 are uneven, e.g., in the form of an irregular wave, in a longitudinal direction within a tolerance of plus or minus up to 0.3 μm. Each of the sides 13 and 14 is convex in a sectional view parallel to the cleavage planes 15 and 16. It is preferable that the stripe active layer 6 have a trapezoid-like shape having two equal sides in a sectional view parallel to the cleavage planes 15 and 16.

The production of the above-mentioned semiconductor laser is now explained with reference to FIGS. 3 through 6.

Figure 3:
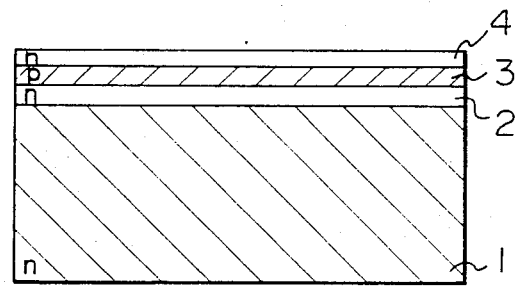
FIGS. 3 through 6 are schematic sectional views of a semiconductor laser in various stages of production in accordance with a method of producing the present invention of FIG. 1.

The N-type layer 2 of $Ga_{0.35}Al_{0.65}As$ having a thickness of 0.5 μm thick, the P-type layer 3 of $Ga_{0.5}Al_{0.5}As$ having a thickness of 0.3 μm, and the N-type layer 4 of GaAs having a thickness of 0.3 μm thick are grown in sequence on the N-type compound semiconductor single crystalline substrate 1 of GaAs having a (100) plane orientation as a result of continuous liquid-phase epitaxial growth, as illustrated in FIG. 3.

Figure 4:
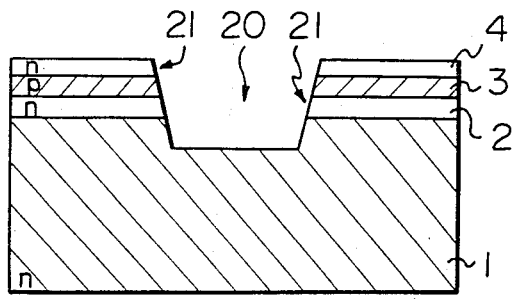

A photoresist layer (not shown) is applied to the N-type layer 4 and is exposed and developed to form an opening defining a straight groove. The N-type layer 4, the P-type layer 3, the N-type layer 2, and the N-type substrate 1 are selectively etched along the <01$\bar{1}$< direction with an anisotropic etching liquid (e.g., a solution containing phosphoric acid) by using the photoresist layer (not shown) as a mask to form a groove 20 having a reverse trapezoid-like shape with two equal sides, as illustrated in FIG. 4. It is preferable that the groove 20 have a width at the top of up to 5 $\mu$m. In this case, the has a width of 4.5 $\mu$m and a depth of 2.5 $\mu$m. The edge line of the groove 20 varies within a small tolerance of up to 0.3 $\mu$m in practice due to a small irregularity of the stripe edges of the mask which are enhanced by the etching. Accordingly, the sides 21 of the groove 20 are made uneven in the longitudinal direction in accordance with the variation of the edge line.

Figure 5:
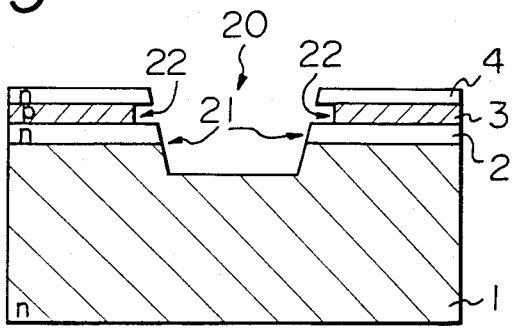

The P-type layer 3 of $Ga_{0.5}Al_{0.5}As$ is selectively etched with an etching liquid (e.g., a solution containing hydrofluoric acid and phosphoric acid) to form recesses 22 having a depth of 0.5 $\mu$m in the sides 21 of the groove 20, as illustrated in FIG. 5. The etching solution comprises hydrofluoric acid, phosphoric acid, and hydrogen peroxide ($HF:H_3PO_4:H_2O_2=80:120:1$), the etching time is 30 seconds and the etching temperature is 25° C. Selective etching is carried out on the basis of the fact that $Ga_{1-x}Al_xAs$ is easily dissolved in hydrofluoric acid when $x \geq 0.5$ but is not easily dissolved in hydrofluoric acid when $x \leq 0.4$.

Figure 6:
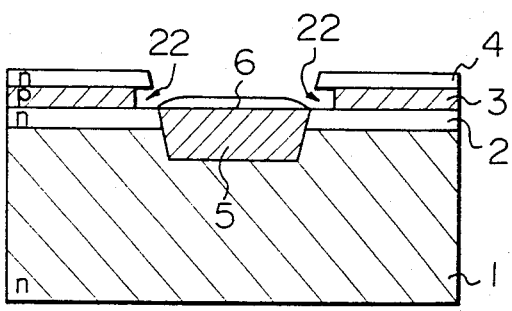

The lower clad layer 5 of the N-type layer of $Ga_{0.7}Al_{0.3}As$ is grown from the bottom of the groove 20 to the lower edge of the recesses 22 by a liquid-phase epitaxial process, as illustrated in FIG. 6. Since the epitaxy growth rate on the (100) plane of the N-type layer 2 and on the P-type layer 3 is much slower that that on the sides of the N-type layer 2 and on the exposed surface of the substrate 1, the upper surface of the lower clad layer 5 can be made flat by suitably controlling the epitaxial growth conditions.

The stripe active layer 6 of the P-type layer of $Ga_{0.95}Al_{0.05}As$ shown in FIG. 2 is grown on the lower clad layer 5 by a liquid-phase epitaxial process, as illustrated in FIG. 6. The lower plane width W, the upper plane width C, and the thickness d of the active layer 6 are 3.5 $\mu$m, 2.3 $\mu$m, and 0.1 $\mu$m, respectively. The surface configuration of the sides 13 and 14 (FIG. 2) of the stripe active layer 6 is influenced by the surface configuration of the sides 21 of the groove 20. Therefore, since the epitaxial growth rate of the P-type layer of $Ga_{0.95}Al_{0.05}As$ on the (100) plane of the layer 2 is also very slow, the reproducibility of the stripe active layer 6 is very good.

The upper clad layer 7 of the P-type layer of $Ga_{0.7}Al_{0.3}As$ having a thickness of 1.5 $\mu$m, and the cap layer 8 of the P-type layer of GaAs having a thickness of 1.0 $\mu$m, are grown on the exposed surface, including the surface of the stripe active layer 6, by a continuous liquid-phase epitaxial process, as illustrated in FIG. 1. The electrodes 9 and 10 are formed on the cap layer 8 and on the substrate 1, respectively, by a conventional process.

Finally, the obtained semiconductor laser chip is cleaved to produce a double-heterojunction laser having the cleavage planes 15 and 16 and a stripe length of 200 $\mu$m.

The produced semiconductor laser has been tested under continuous wave operation to ascertain that is has the characteristic laser output power and far field pattern.

Figure 7:
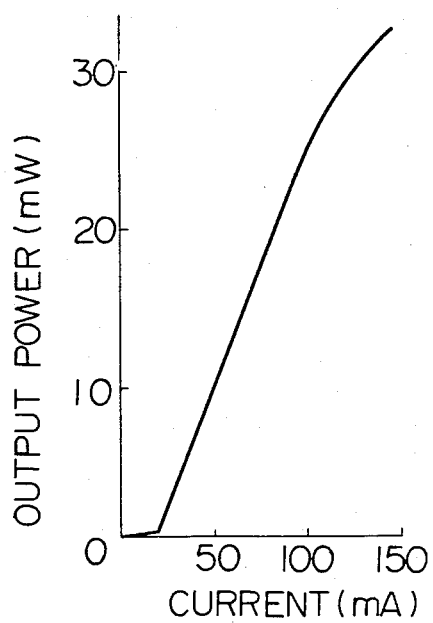
FIG. 7 is a graph of the laser output power-current characteristic of the present invention.

The relationship between the laser output power and the current is shown in FIG. 7. As is evident from FIG. 7, the laser output power increases extremely in proportion to the current up to 20 mW and further can increase up to approximately 30 mW without abnormalities. The threshold current is 20 mA or less, which is satisfactorily low in spite of the stripe width (3.5 $\mu$m) of the active layer.

Figure 8A:
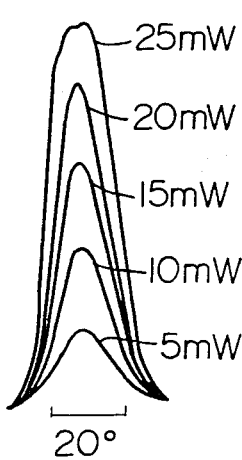
FIG. 8A is a diagram of the far field patterns parallel to the junction plane at various power levels of the semiconductor laser according to the present invention.
Figure 8B:
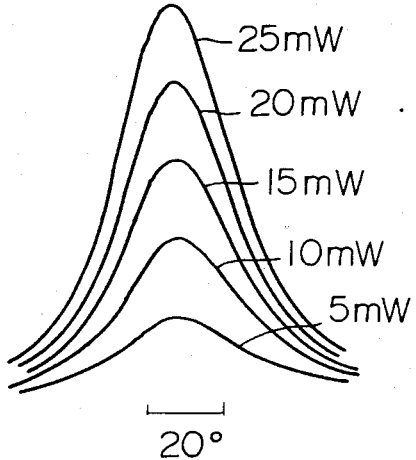
FIG. 8B is a diagram of far field patterns vertical to the junction plane at various power levels of the semiconductor laser according to the present invention.

The far field pattern parallel to the junction plane is shown in FIG. 8A, and the far field pattern vertical to the junction plane is shown in FIG. 8B. As is evident from FIGS. 8A and 8B, the produced semiconductor laser shows a stable fundamental transverse mode lasing up to an output power of 20 mW. At an output power of 25 mW, the far field pattern distribution parallel to the junction plane becomes slightly abnormal.

In the semiconductor laser according to the present invention, the stripe active layer 6 has a long, thin cube portion having the width C and the thickness d at the center thereof, in which portion the scattering loss of the laser beam is very small. On the other hand, in the other portion of the active layer 6 having the sides 13 and 14, the scattering loss of the laser beam is large due to the uneven surfaces of the sides 13 and 14. The fundamental transverse mode is mainly distributed in the long, thin cube portion while parts of a higher order transverse mode are distributed in the other portion having the sides 13 and 14. In the present invention, the large scattering loss of the laser beam in the other portion suppresses the higher order transverse mode lasing. Accordingly, it is possible to maintain a stable fundamental transverse mode lasing even at a high laser output power and to obtain a semiconductor laser having the above-mentioned excellent characteristic.

It will be obvious that the present invention is not restricted to the above-mentioned embodiments and that many variations are possible for a person having an ordinary skill in the art without departing from the scope of the present invention. For example, the stripe active layer may have a suitable shape (e.g., a reverse trapezoid-like shape, a parallelogram shape, etc.) having sloped sides in a sectional view parallel to the cleavage planes of the reflective mirrors.

We claim:

1. A semiconductor laser having cleavage planes, comprising:
    a compound single crystalline semiconductor substrate;
    a current-blocking multilayer, formed on said compound single crystalline semiconductor substrate, having an upper layer and a lower layer forming a reverse-biased PN junction, said compound single crystalline semiconductor substrate and said multilayer having a groove formed therein, extending from the upper layer of said multilayer into said compound single crystalline semiconductor substrate, recesses formed in the sides of said groove by selectively etching said lower layer;
    a lower clad layer, embedded in said groove, extending from the bottom of said groove to a lower edge of said recesses;
    a stripe active layer formed on said lower clad layer, having an upper plane and a lower plane, and having sides inclined toward said upper and lower planes, said upper and lower planes being substantially parallel to each other;
    an upper clad layer formed on said stripe active layer and said multilayer so as to fill said groove, said lower and upper clad layers surrounding said stripe active layer; and electrode layers formed on said compound single crystalline semiconductor substrate and said upper clad layers, respectively.

2. A semiconductor laser according to claim 1, wherein said sides are uneven in a longitudinal direction.

3. A semiconductor laser according to claim 1, wherein each of said sides is convex in a sectional view parallel to the cleavage planes of the semiconductor laser.

4. A semiconductor laser according to claim 1, wherein said stripe active layer has a trapezoid-like shape having two equal sides in a sectional view parallel to the cleavage planes of the semiconductor laser.

* * * * *

UNITED STATES PATENT AND TRADEMARK OFFICE
CERTIFICATE OF CORRECTION

PATENT NO. : 4,532,631
DATED : JULY 30, 1985
INVENTOR(S) : KATSUHITO SHIMA ET AL.

It is certified that error appears in the above-identified patent and that said Letters Patent is hereby corrected as shown below:

```
FRONT PAGE [56] References Cited
                Col. 2, line 7, "1.3 m" should be --1.3 µm--;

[57] ABSTRACT
                line 1, "laser" should be --laser,--.

Col. 1, line 50, "laser is" should be --laser--; and
                 "layer" should be --layer is--.

Col. 2, line 17, "of" should be --of the--;
        line 27, "(Y" should be --(y--;
        line 59, delete "thick";
        line 61, delete "thick".

Col. 3, line 2, "<011<" should be --<011>--;
        line 9, after "the" insert --groove 20--.

Col. 4, line 4, "further can" should be --can further--.
```

Signed and Sealed this

Nineteenth Day of November 1985

[SEAL]

Attest:

DONALD J. QUIGG

Attesting Officer

Commissioner of Patents and Trademarks